(12) United States Patent (10) Patent No.: US 12,683,600 B2

Sato (45) Date of Patent: Jul. 14, 2026

(54) SEMICONDUCTOR DEVICE AND OVERCURRENT PROTECTION DEVICE

(71) Applicant: FUJI ELECTRIC CO., LTD., Kawasaki (JP)

(72) Inventor: Shigeki Sato, Azumino-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 136 days.

(21) Appl. No.: 18/605,427

(22) Filed: Mar. 14, 2024

(65) Prior Publication Data

US 2024/0223180 A1 Jul. 4, 2024

Related U.S. Application Data

(63) Continuation of application No. PCT/JP2023/007712, filed on Mar. 2, 2023.

(30) Foreign Application Priority Data

Apr. 6, 2022 (JP) ................................. 2022-063257

(51) Int. Cl.
*H03K 17/082* (2006.01)
*G01R 19/00* (2006.01)
(52) U.S. Cl.
CPC ..... *H03K 17/0828* (2013.01); *G01R 19/0092* (2013.01); *H03K 2217/0027* (2013.01)
(58) Field of Classification Search
CPC ....... H03K 17/0828; H03K 2217/0027; G01R 19/0092
See application file for complete search history.

(56) References Cited

U.S. PATENT DOCUMENTS

| | | | |
|---|---|---|---|
| 5,500,619 A | 3/1996 | Miyasaka | |
| 2015/0185275 A1 | 7/2015 | Sekigawa | |
| | (Continued) | | |

FOREIGN PATENT DOCUMENTS

| | | | |
|---|---|---|---|
| EP | 561386 A1 | 9/1993 | |
| EP | 615342 A2 | 9/1994 | |
| | (Continued) | | |

OTHER PUBLICATIONS

Translation of JP H0548434. Jun. 25, 1993. (Year: 1993).*

(Continued)

*Primary Examiner* — Thienvu V Tran
*Assistant Examiner* — Christopher J Clark
(74) *Attorney, Agent, or Firm* — Rabin & Berdo, P.C.

(57) ABSTRACT

A semiconductor device includes an output element configured to switch on and off according to a drive signal to drive a load, a current monitoring element configured to monitor a current flowing through the output element, and a capacitor having one end connected to a gate of the output element and another end connected to a gate of the current monitoring element. The semiconductor device further includes a current detection resistor configured to output a sense current detection signal obtained by converting a sense current output from the current monitoring element into a voltage, and an overcurrent detection circuit configured to detect an overcurrent state of the output element, by comparing the sense current detection signal with a reference voltage.

13 Claims, 11 Drawing Sheets

(56)            References Cited

U.S. PATENT DOCUMENTS

2015/0270387 A1 *   9/2015  Kumada ............. H10D 12/481
                                                    257/140
2019/0280473 A1     9/2019  Akahane
2020/0028505 A1     1/2020  Sasaki
2023/0375599 A1 *  11/2023  Pidutti ............... H02M 1/0009

FOREIGN PATENT DOCUMENTS

EP            730347  A2    9/1996
JP        H05-048434  U    6/1993
JP        H06-053795  A    2/1994
JP       2019-149558  A    9/2019
JP       2020-014103  A    1/2020
WO      2014/097739  A1    6/2014
WO      2018/211840  A1   11/2018

OTHER PUBLICATIONS

International Search Report for PCT/JP2023/007712, mailed on May 9, 2023.
Written Opinion for PCT/JP2023/007712, mailed on May 9, 2023.

* cited by examiner

SEMICONDUCTOR DEVICE AND OVERCURRENT PROTECTION DEVICE

CROSS-REFERENCE TO RELATED APPLICATION

This application is a continuation application of International Application filed on Mar. 2, 2023, which PCT/JP2023/007712 designated the U.S., which claims priority to Japanese Patent Application No. 2022-063257, filed on Apr. 6, 2022, the entire contents of which are incorporated herein by reference.

BACKGROUND OF THE INVENTION

1. Field of the Invention

An embodiment discussed herein relates to a semiconductor device and an overcurrent protection device.

2. Background of the Related Art

Development of next-generation semiconductor elements such as silicon carbide (SiC) compound semiconductor elements and gallium nitride (GaN) compound semiconductor elements has been progressing as a next-generation technology of insulated gate bipolar transistors (IGBTs), which are power semiconductor elements.

As related art, for example, there has been proposed a technique of detecting a transient sensing period of a sense current detection signal on the basis of a semiconductor element being turned on, and controlling the semiconductor element on the basis of the sense current detection signal of the transient sensing period (see, for example, International Publication Pamphlet No. WO2018/211840).

A semiconductor device called an intelligent power switch (IPS) includes a main IGBT and a sense IGBT. Here, the main IGBT is a power semiconductor element for load management, and the sense IGBT is a current-monitoring power semiconductor element and causes a sense current to flow, the sense current being proportional to a current flowing through the main IGBT. In addition, the IPS includes an overcurrent detection circuit that detects an overcurrent of the main IGBT on the basis of a detection signal of the sense current (a sense current detection signal).

In such a conventional IPS, oscillations with overshoot occur in the sense current detection signal during a period (transient sensing period) from transient rising to falling of the sense current detection signal. In this case, if the voltage of the oscillations occurring exceeds the rating, for example, the overcurrent detection circuit may malfunction, devices such as IGBTs may be damaged, or another problem may be caused, which results in a decrease in the reliability of device operation.

SUMMARY OF THE INVENTION

According to one aspect, there is provided a semiconductor device, including: an output element configured to switch on and off according to a drive signal to drive a load; a current monitoring element configured to monitor a current flowing through the output element; and a capacitor having one end connected to a gate of the output element and another end connected to a gate of the current monitoring element.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
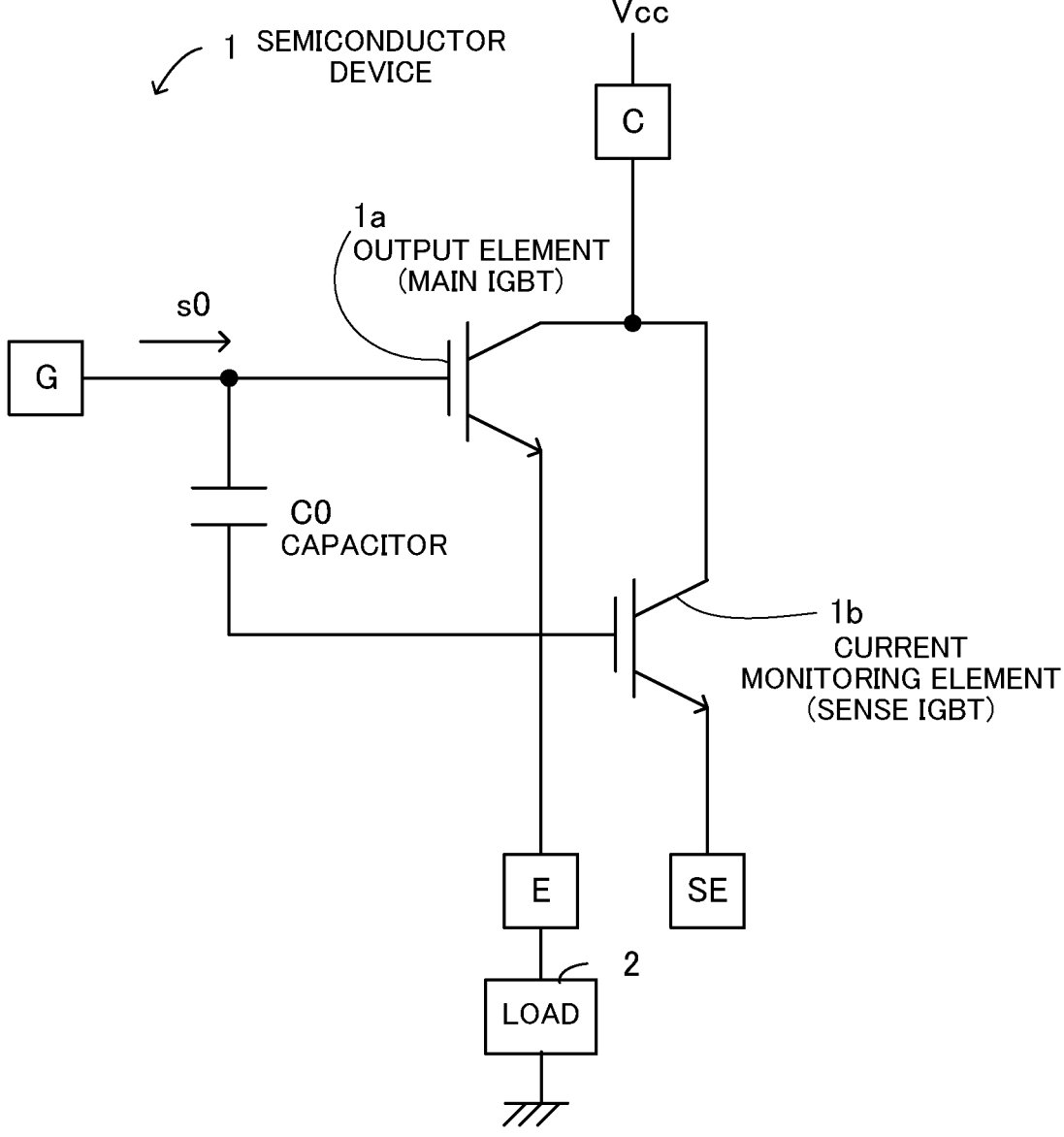
FIG. 1 is a view for describing an example of a semiconductor device.

Hereinafter, an embodiment will be described with reference to drawings. Note that, in the description and drawings, elements having substantially the same functions may be denoted by the same reference numeral to omit a repeated description thereof.

FIG. 1 is a view for describing an example of a semiconductor device. A semiconductor device 1 includes an output element 1a, a current monitoring element 1b, and a capacitor C0.

The output element 1a and current monitoring element 1b are each an insulated gate bipolar transistor (IGBT) or a reverse conducting (RC)-IGBT, for example. The RC-IGBT is formed by integrating an IGBT and a free-wheeling diode (FWD) in a single chip. Alternatively, an SiC device may be used. The SiC device may be an SiC-metal-oxide-semiconductor field-effect transistor (MOSFET) or another. In the following description, the output element is referred to as a main IGBT, and the current monitoring element is referred to as a sense IGBT.

The collector of the main IGBT 1a and the collector of the sense IGBT 1b are connected to a power supply voltage Vcc via a terminal C. The emitter of the main IGBT 1a is connected to a load 2 via a terminal E.

The sense emitter of the sense IGBT 1b is connected to a terminal SE. The gate of the main IGBT 1a is connected to one end of the capacitor C0 and a terminal G, and the other end of the capacitor co is connected to the gate of the sense IGBT 1b.

The main IGBT 1a performs switching according to a drive signal s0 to operate (drive) the load 2. In this case, in the case where the drive signal so is to turn on the main IGBT 1a, the main IGBT 1a is turned on, thereby causing a current to flow from the collector to the emitter thereof. On the other hand, the sense IGBT 1*b* is an element that monitors the current flowing through the main IGBT 1*a*. In the case where the drive signal s0 is to turn on the main IGBT 1*a*, the sense IGBT 1*b* causes a sense current, which is proportional to the current flowing through the main IGBT 1*a*, to flow from the collector to the sense emitter thereof.

Figure 2:
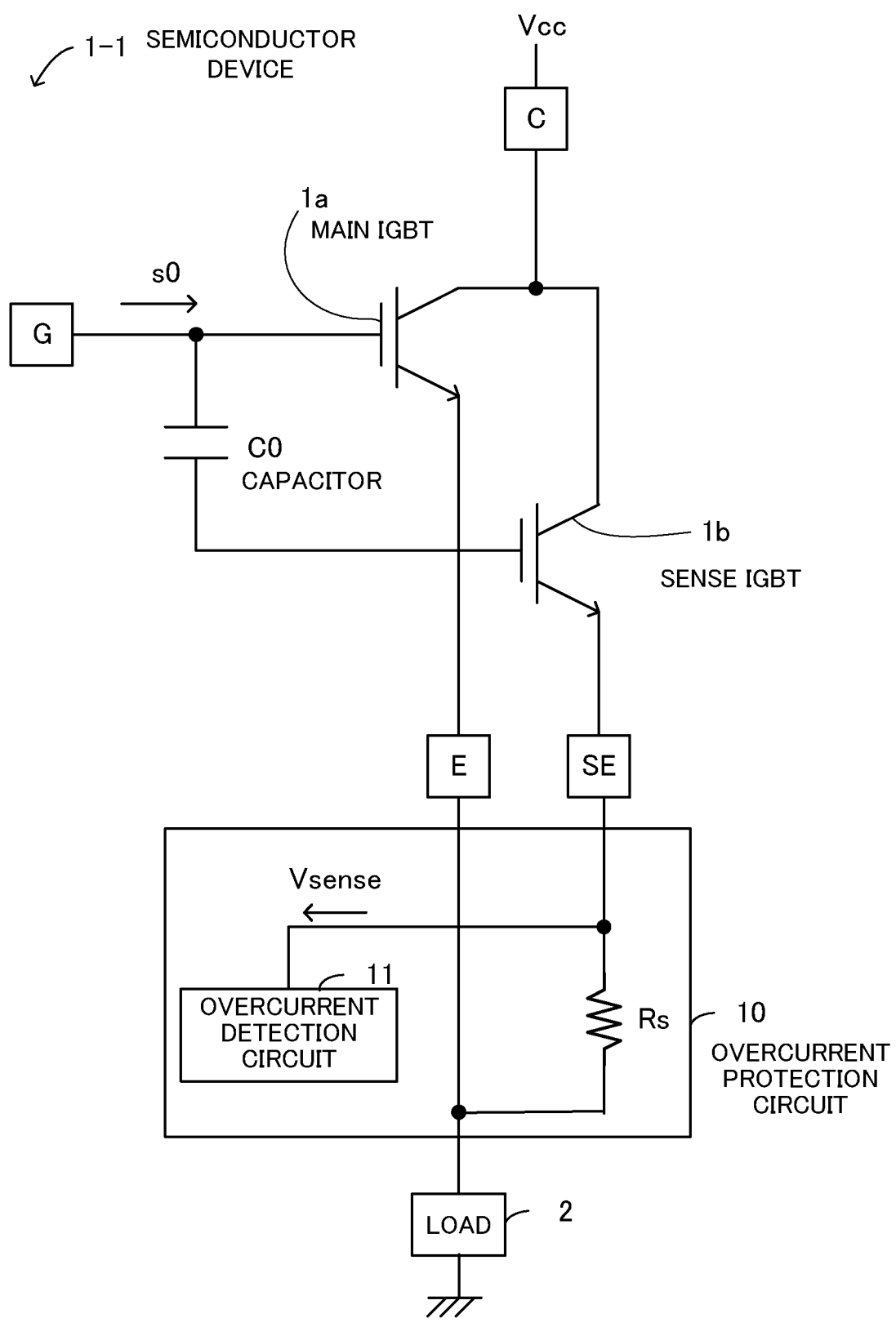
FIG. 2 illustrates an example of a configuration of a semiconductor device with an overcurrent protection circuit.

FIG. 2 illustrates an example of a configuration of a semiconductor device with an overcurrent protection circuit. A semiconductor device 1-1 includes a main IGBT 1*a*, a sense IGBT 1*b*, a capacitor C0, and an overcurrent protection circuit 10. The overcurrent protection circuit 10 includes a resistor Rs (current detection resistor) and an overcurrent detection circuit 11. One end of the resistor Rs is connected to the sense emitter of the sense IGBT 1*b* and the input terminal of the overcurrent detection circuit 11, and the other end of the resistor Rs is connected to the emitter of the main IGBT 1*a* and a load 2.

The resistor Rs outputs, from its one end, a sense current detection signal Vsense obtained by converting a sense current output from the sense IGBT 1*b* into a voltage. In addition, the overcurrent detection circuit 11 detects an overcurrent state of the main IGBT 1*a* by comparing the sense current detection signal Vsense with a reference voltage.

The above-described semiconductor device 1-1 has a configuration in which the gate of the main IGBT 1*a* and the gate of the sense IGBT 1*b* are connected to each other via the capacitor C0. This configuration makes it possible to suppress oscillations that occur in the sense current detection signal Vsense during a transient sensing period of the sense current detection signal Vsense.

Self-Charging of Sense IGBT

Figure 3:
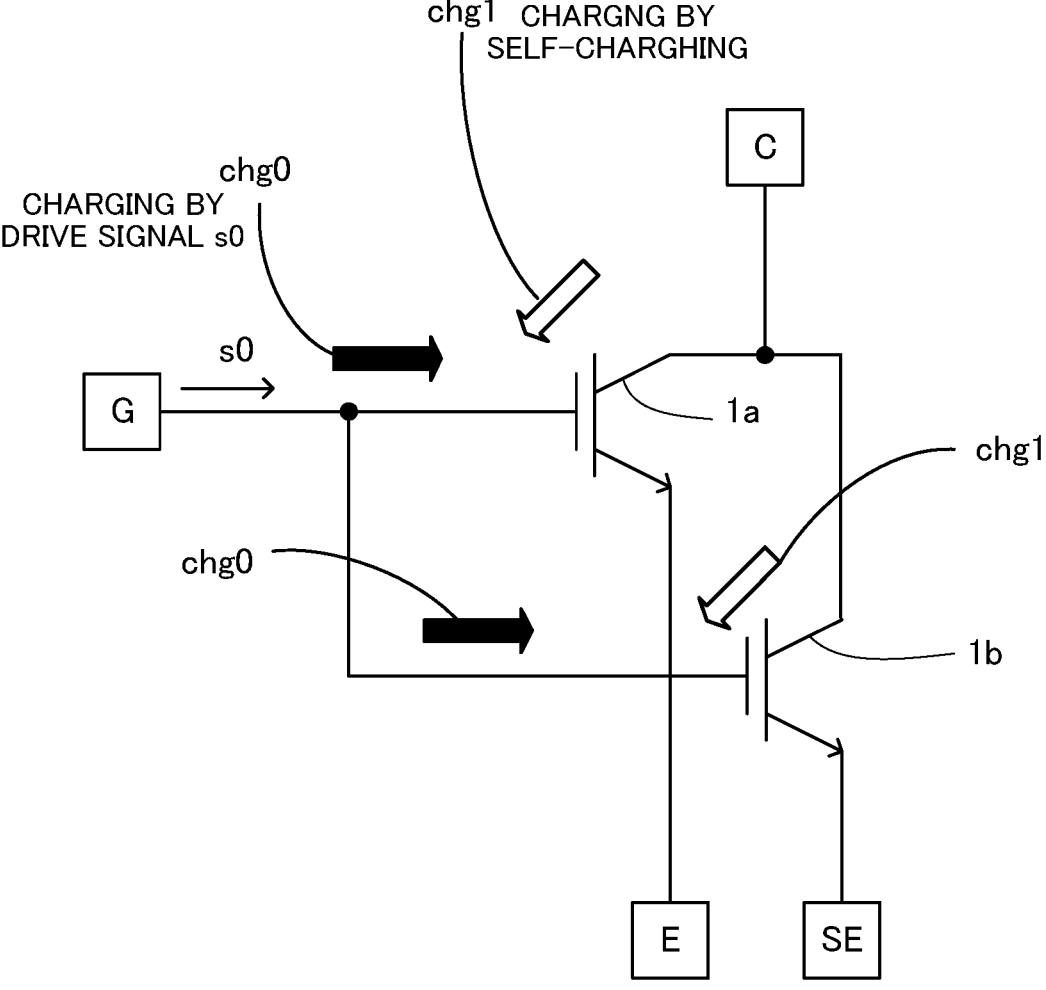
FIG. 3 is a view for describing self-charging of a sense IGBT.

FIG. 3 is a view for describing self-charging of a sense IGBT. In a power semiconductor element like an IGBT, a phenomenon known as self-charging may occur when the IGBT is in on-state.

Self-charging is a phenomenon in which holes injected from the collector of an IGBT charge a gate oxide film around a trench region to thereby raise the gate voltage.

When the self-charging occurs, the gate voltage rises due to not only charging chg0 by a drive signal s0 output from a gate driver but also charging chg1 by the self-charging.

In addition, usually, the chip area of the sense IGBT 1*b* is smaller than that of the main IGBT 1*a*. Since the main IGBT 1*a* and the sense IGBT 1*b* have such a size relationship in terms of chip area, the parasitic gate-emitter (GE) capacitance of the main IGBT 1*a* is different from that of the sense IGBT 1*b*.

Therefore, in the case where the drive signal so is to turn on the main IGBT 1*a*, the sense IGBT 1*b* completes charging faster than the main IGBT 1*a*, and begins to turn on. For this reason, the sense IGBT 1*b* goes to on-state before the main IGBT 1*a*. Consequently, the sense IGBT 1*b* is affected by electromotive force due to physical differences in the wiring paths around the IGBTs, earlier than the main IGBT 1*a*.

As described above, the charging chg1 by the self-charging causes the gate voltage of the sense IGBT 1*b* to rise earlier than the gate voltage of the main IGBT 1*a*. Therefore, during a transient sensing period, oscillations whose waveform rises due to the charging chg1 by the self-charging occur in a sense current detection signal Vsense that is output based on a sense current flowing from the sense emitter of the sense IGBT 1*b*.

In addition, if the voltage level of the oscillations is high and the period of the oscillations occurring is long, the overcurrent detection circuit may malfunction, devices such as IGBTs may be damaged, or another problem may occur, as described earlier. In view of the above circumstances, the present disclosure provides a configuration in which a capacitor is connected to the gate of a sense IGBT, in order to suppress such oscillations.

Simulation Waveforms

Figure 4:
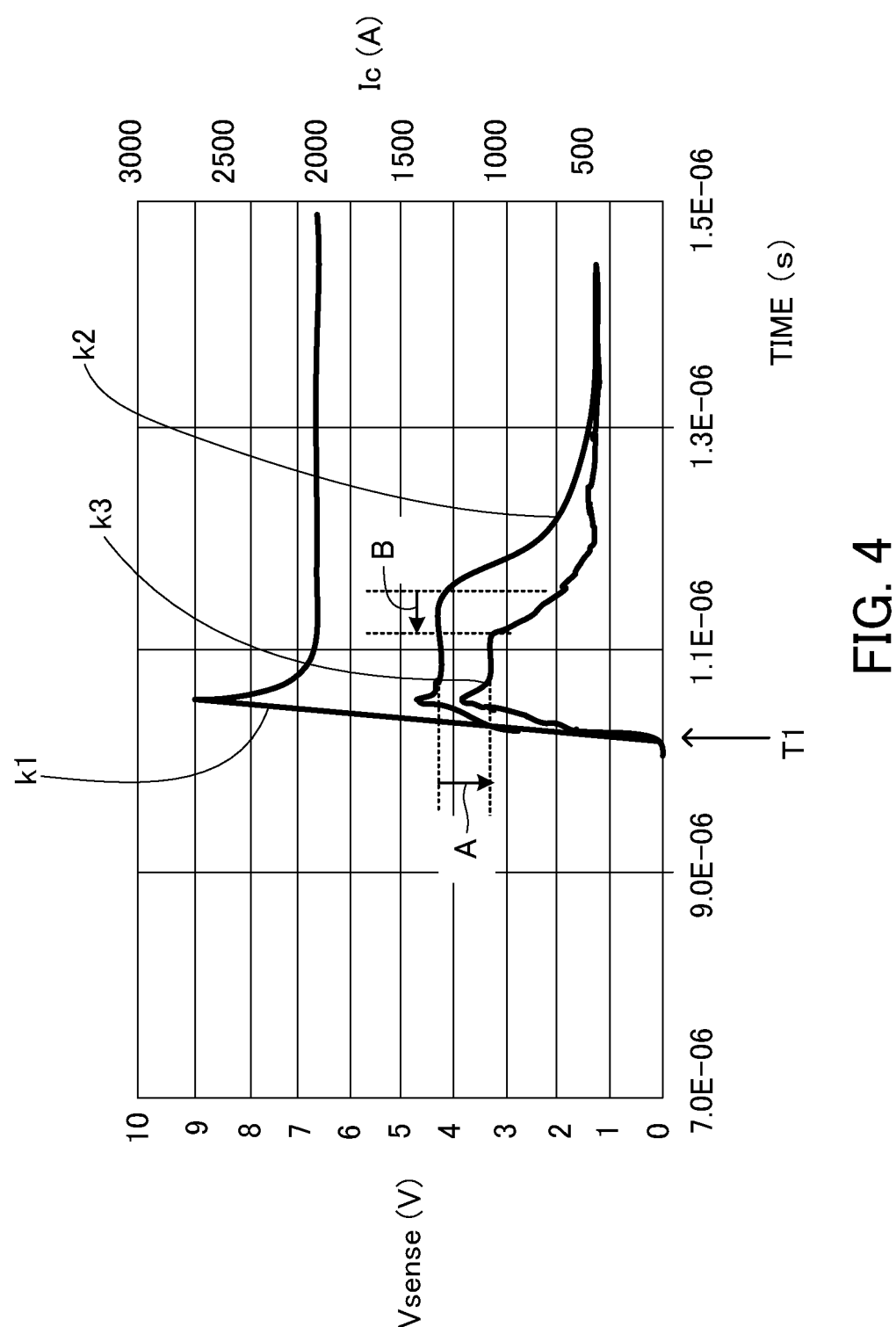
FIG. 4 illustrates examples of simulation waveforms.

FIG. 4 illustrates examples of simulation waveforms. The vertical axis on the left represents the voltage (V) of a sense current detection signal Vsense, the vertical axis on the right represents a collector current Ic (A), and the horizontal axis represents time (s).

Waveform k1: The waveform of a collector current Ic that flows through the collector of a main IGBT 1*a* and the collector of a sense IGBT 1*b*. When the main IGBT 1*a* and the sense IGBT 1*b* are turned on, the collector current Ic flows at time T1.

As described earlier, a gate voltage rises due to self-charging as well as a drive signal s0. Therefore, the collector current Ic rises and reaches a peak. After that, the rise in the gate voltage due to the self-charging decreases. The collector current Ic decreases accordingly and remains at a fixed value.

Waveform k2: The waveform of oscillations in a sense current detection signal Vsense of a semiconductor device (conventional device) without a capacitor C0. As the collector current Ic rises, oscillations occur in the sense current detection signal Vsense.

Waveform k3: The waveform of oscillations in a sense current detection signal Vsense of the semiconductor device 1-1 of the present embodiment in which the gate of the main IGBT 1*a* and the gate of the sense IGBT 1*b* are connected to each other via the capacitor C0.

The semiconductor device 1-1 has a configuration in which the gate of the main IGBT 1*a* and the gate of the sense IGBT 1*b* are connected to each other via the capacitor C0 functioning as a low-pass filter. The capacitor C0 is able to delay the charging of the gate voltage of the sense IGBT 1*b*. This suppresses oscillations that occur in the sense current detection signal Vsense due to a rise in the collector current Ic.

That is to say, the oscillation voltage of the sense current detection signal Vsense of waveform k3 is lower than the oscillation voltage of the sense current detection signal Vsense of waveform k2 (oscillation voltage reduction A). Moreover, the oscillation period of the sense current detection signal Vsense of waveform k3 is shorter than the oscillation period of the sense current detection signal Vsense of waveform k2 (oscillation period reduction B).

As described above, with the configuration of the present embodiment, in a transient sensing period of the sense current detection signal Vsense, it is possible to suppress oscillations that occur in the sense current detection signal Vsense. In this connection, the capacitor C0 is not parasitic capacitance existing between the gate and emitter of an IGBT, and has nothing to do with the expansion of a depletion layer during operation of the IGBT or the opening and closing of a channel due to a gate voltage.

Modifications of Semiconductor Device

Figure 5:
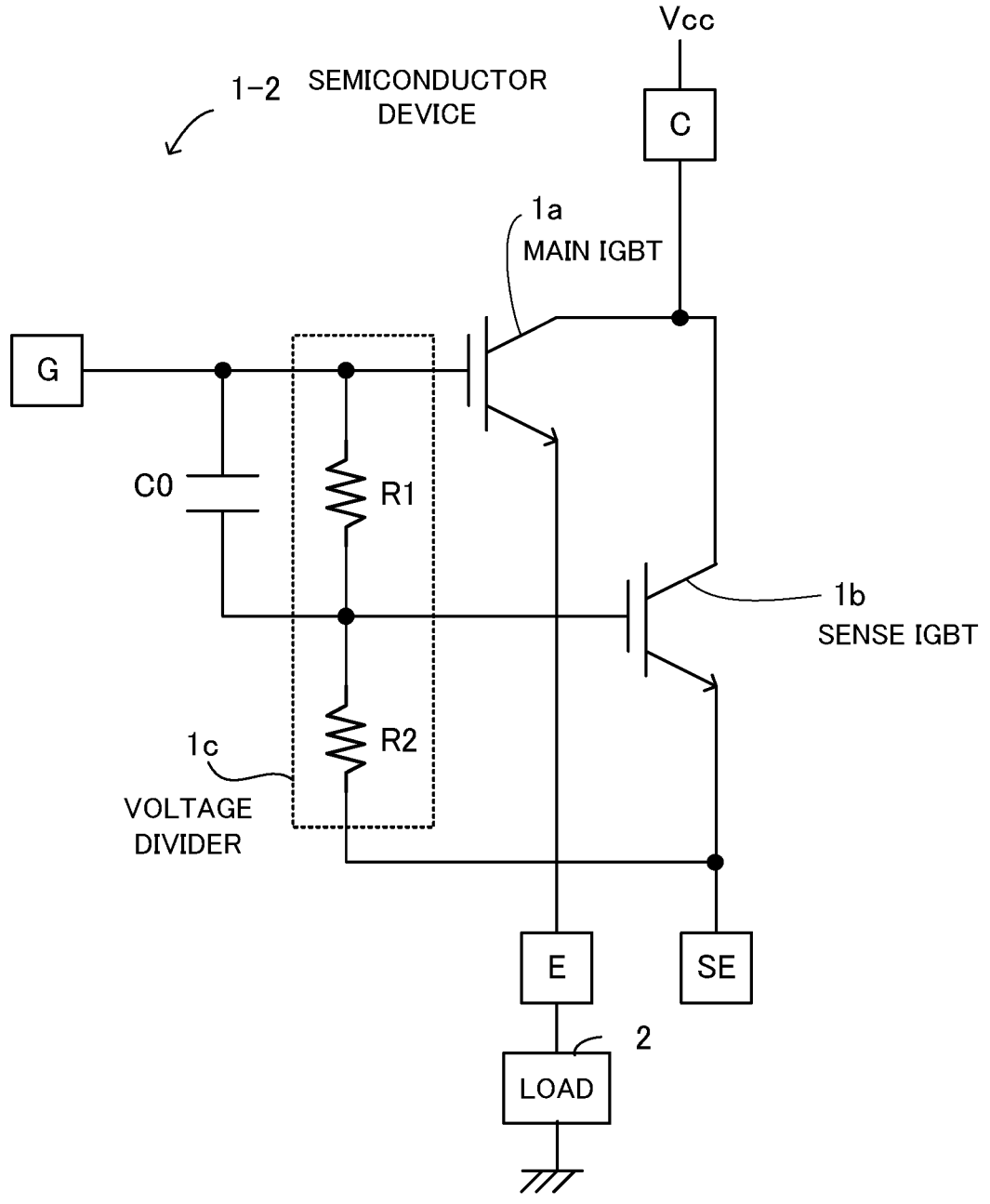
FIG. 5 illustrates an example of a modified semiconductor device.

FIG. 5 illustrates an example of a modified semiconductor device. A semiconductor device 1-2 includes a main IGBT 1*a*, a sense IGBT 1*b*, a capacitor C0, and a voltage divider 1*c*. The voltage divider 1*c* includes a resistor R1 (first resistor) and a resistor R2 (second resistor).

The collector of the main IGBT 1*a* and the collector of the sense IGBT 1*b* are connected to a power supply voltage Vcc via a terminal C. The emitter of the main IGBT 1*a* is connected to a load 2 via a terminal E.

The gate of the main IGBT 1a is connected to a terminal G, one end of the capacitor C0, and one end of the resistor R1. The gate of the sense IGBT 1b is connected to the other end of the capacitor C0, the other end of the resistor R1, and one end of the resistor R2. The other end of the resistor R2 is connected to the sense emitter of the sense IGBT 1b and a terminal SE.

Figure 6:
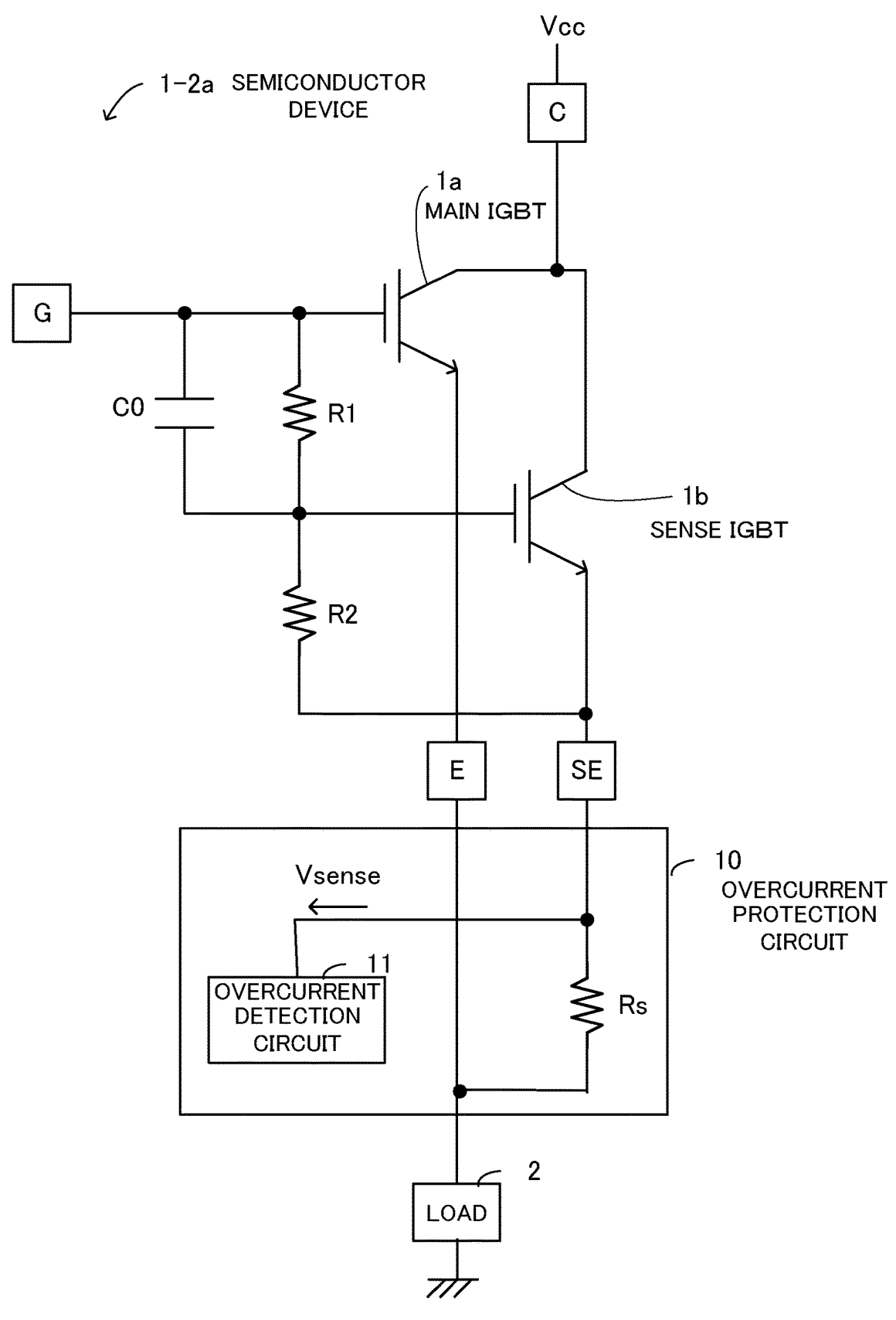
FIG. 6 illustrates an example of a configuration of a semiconductor device with an overcurrent protection circuit.

FIG. 6 illustrates an example of a configuration of a semiconductor device with an overcurrent protection circuit. A semiconductor device 1-2a includes a main IGBT 1a, a sense IGBT 1b, a capacitor C0, resistors R1 and R2, and an overcurrent protection circuit 10.

The overcurrent protection circuit 10 includes a resistor Rs (current detection resistor) and an overcurrent detection circuit 11. One end of the resistor Rs is connected to the sense emitter of the sense IGBT 1b, the other end of the resistor R2, and the input terminal of the overcurrent detection circuit 11. The other end of the resistor Rs is connected to the emitter of the main IGBT 1a and a load 2.

In the above-described semiconductor device 1-2a, the gate of the main IGBT 1a and the gate of the sense IGBT 1b are connected to each other via the capacitor C0. In addition, the semiconductor device 1-2a includes the resistors R1 and R2 to divide the gate voltage of the main IGBT 1a and apply the divided voltage to the gate of the sense IGBT 1b.

With this configuration, it is possible to suppress oscillations that occur in a sense current detection signal Vsense during a sensing period of the sense current detection signal Vsense. In addition, the resistors for voltage dividing are able to adjust the gate voltage of the sense IGBT 1b, which allows for higher flexibility in design for oscillation suppression control.

Figure 7:
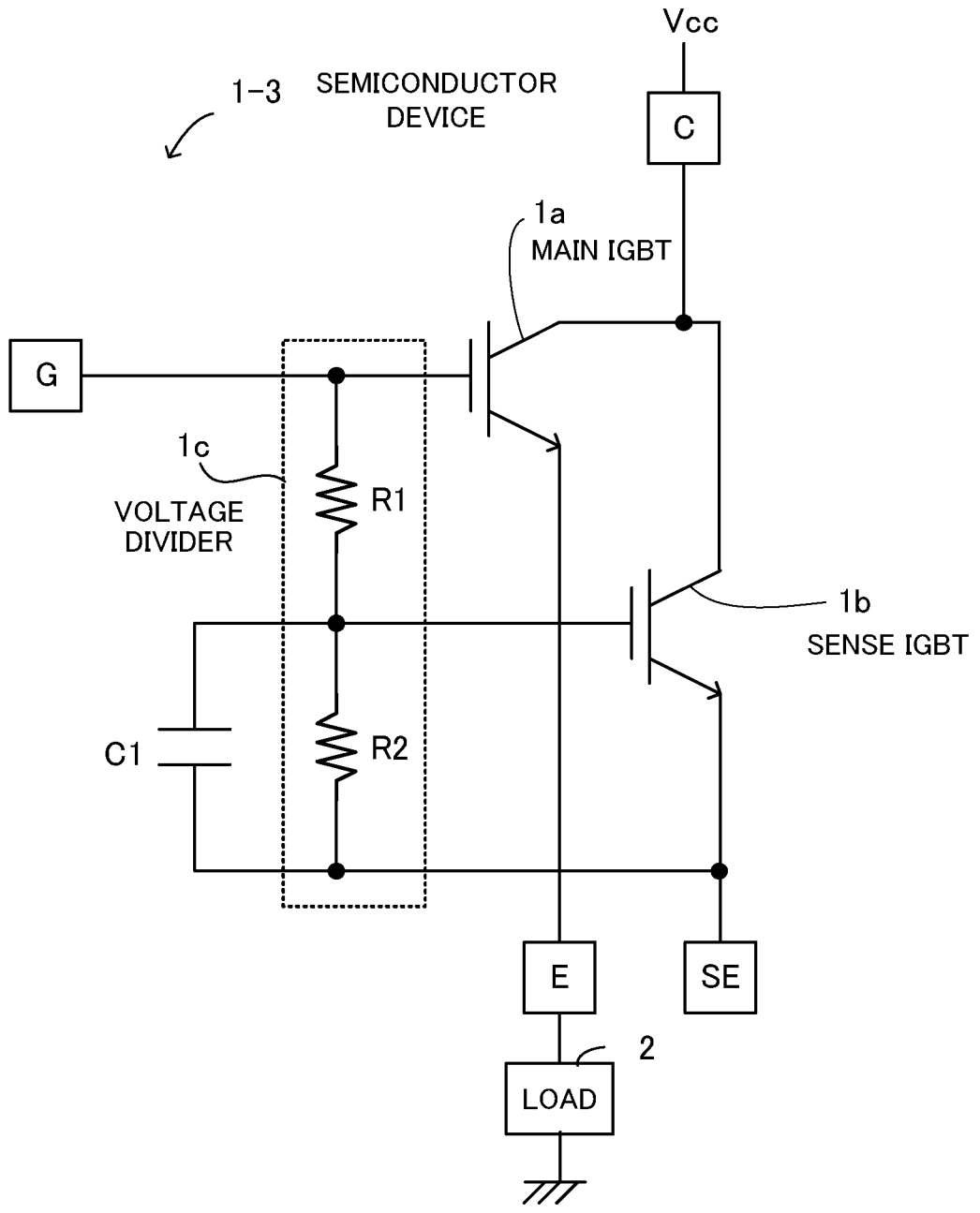
FIG. 7 is an example of a modified semiconductor device.

FIG. 7 is an example of a modified semiconductor device. A semiconductor device 1-3 includes a main IGBT 1a, a sense IGBT 1b, a capacitor C1, and a voltage divider 1c. The voltage divider 1c includes resistors R1 and R2.

The collector of the main IGBT 1a and the collector of the sense IGBT 1b are connected to a power supply voltage Vcc via a terminal C. The emitter of the main IGBT 1a is connected to a load 2 via a terminal E.

The gate of the main IGBT 1a is connected to a terminal G and one end of the resistor R1. The gate of the sense IGBT 1b is connected to one end of the capacitor C1, the other end of the resistor R1, and one end of the resistor R2. The sense emitter of the sense IGBT 1b is connected to the other end of the capacitor C1 and the other end of the resistor R2.

Figure 8:
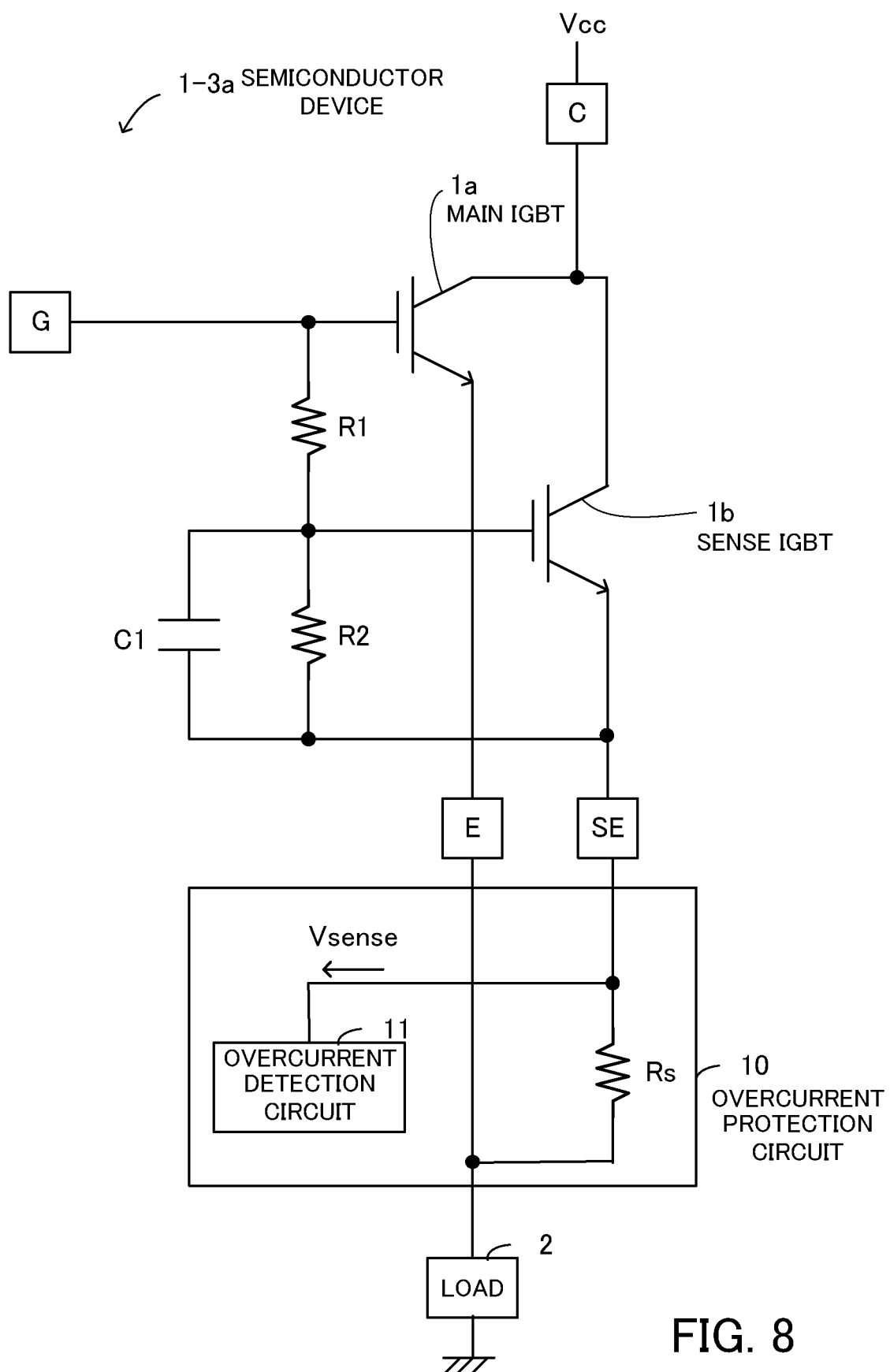
FIG. 8 is an example of a configuration of a semiconductor device with an overcurrent protection circuit.

FIG. 8 is an example of a configuration of a semiconductor device with an overcurrent protection circuit. A semiconductor device 1-3a includes a main IGBT 1a, a sense IGBT 1b, a capacitor C1, resistors R1 and R2, and an overcurrent protection circuit 10. The overcurrent protection circuit 10 includes a resistor Rs (current detection resistor) an overcurrent and detection circuit 11. One end of the resistor Rs is connected to the sense emitter of the sense IGBT 1b, the other end of the resistor R2, the other end of the capacitor C1, and the input terminal of the overcurrent detection circuit 11, and the other end of the resistor Rs is connected to the emitter of the main IGBT 1a and a load 2.

In the above-described semiconductor device 1-3a, the gate of the sense IGBT 1b and the sense emitter of the sense IGBT 1b are connected to each other via the capacitor C1, and the resistors R1 and R2 are provided to divide the gate voltage of the main IGBT 1a and apply the divided voltage to the gate of the sense IGBT 1b. With this configuration, it is possible to suppress oscillations that occur in a sense current detection signal Vsense during a transient sensing period of the sense current detection signal Vsense.

6

Capacitance of Capacitor

To effectively suppress oscillations, the capacitance (F) of the capacitor co of each semiconductor device illustrated in FIGS. 1, 2, 5, and 6 is in the range of 1E-12 to 1E-07, for example. The capacitance (F) of the capacitor C0 is preferably 1E-10 in this range.

In addition, to effectively suppress oscillations, the capacitance (F) of the capacitor C1 of each semiconductor device illustrated in FIGS. 7 and 8 is in the range of 1E-11 to 1E-04, for example. The capacitance (F) of the capacitor C1 is preferably 1E-9, 1E-8, or 1E-7 in this range.

In this connection, the above is just an example, and an effective capacitance range of a capacitor is determined according to the matching between an oscillation frequency (overshoot frequency within a transient sensing period) and the input capacitance (Cies) of an IGBT.

Overcurrent Protection Device

Figure 9:
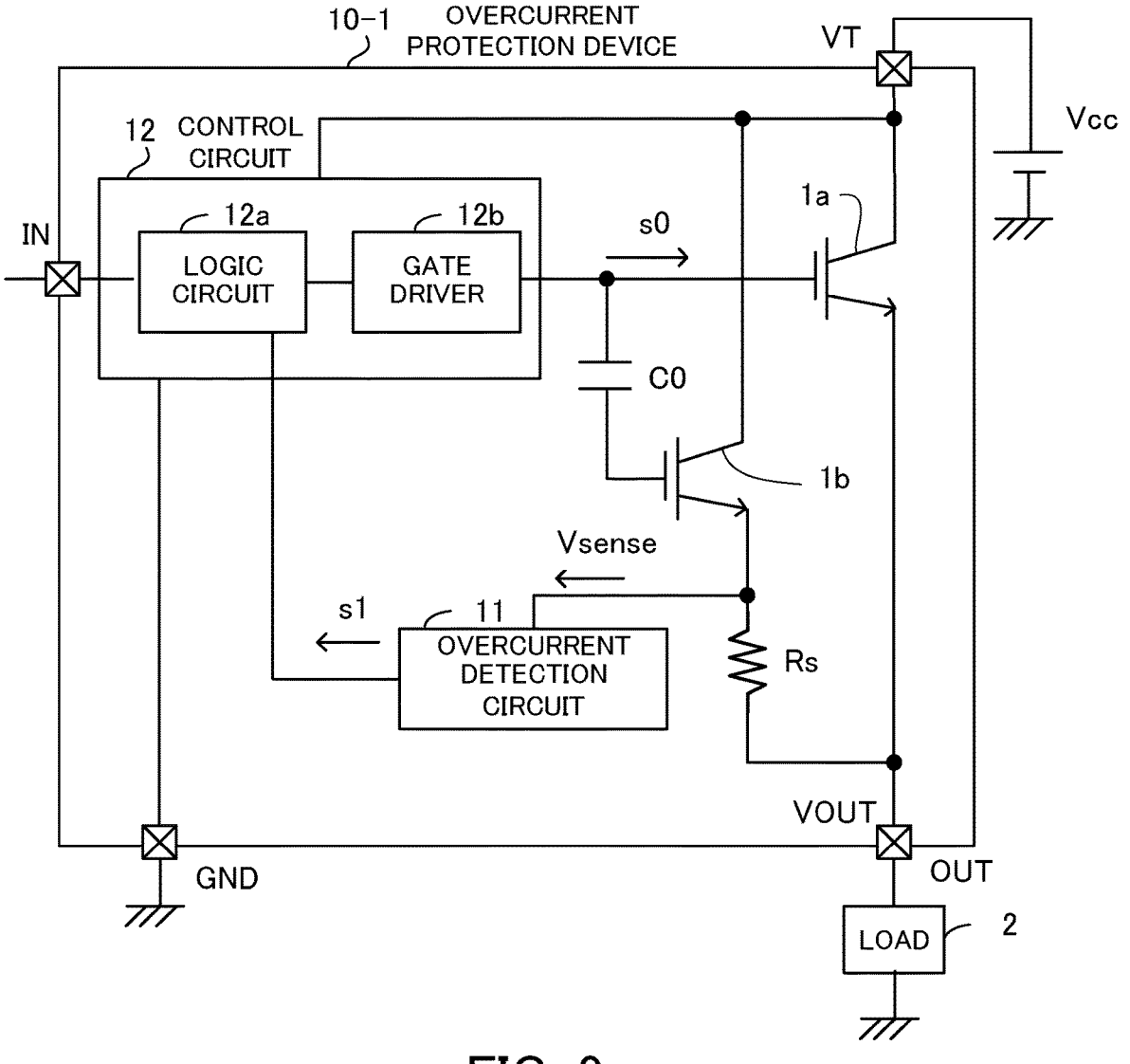
FIG. 9 illustrates an example of a configuration of an overcurrent protection device.

The following describes overcurrent protection devices to each of which semiconductor device of the present disclosure is applied. FIG. 9 illustrates an example of a configuration of an overcurrent protection device. An overcurrent protection device 10-1 includes an input terminal IN, an output terminal OUT, a power supply terminal VT, and a ground terminal GND.

A pulse-shaped control signal output from a microcomputer or the like is input to the input terminal IN. The output terminal OUT is connected to a load 2. The power supply terminal VT is connected to a power supply voltage Vcc, and the ground terminal GND is connected to the ground (GND).

In addition, the overcurrent protection device 10-1 includes a main IGBT 1a, a sense IGBT 1b, a capacitor C0, a resistor Rs, an overcurrent detection circuit 11, and a control circuit 12. The control circuit 12 includes a logic circuit 12a and a gate driver 12b.

The logic circuit 12a receives the control signal coming via the input terminal IN and generates a logic signal to turn on or off the main IGBT 1a. The gate driver 12b generates a drive signal s0 of turning on or off the main IGBT 1a on the basis of the logic signal output from the logic circuit 12a, and applies the drive signal s0 to the gate of the main IGBT 1a.

The resistor Rs is connected between the sense emitter of the sense IGBT 1b and the emitter of the main IGBT 1a, and detects a potential generated by a sense current flowing through the resistor Rs from the sense emitter. Thereby, the sense current is detected as a sense current detection signal Vsense.

The overcurrent detection circuit 11 detects whether the main IGBT 1a is in an overcurrent state, by comparing the sense current detection signal Vsense with a reference voltage, and outputs an overcurrent detection signal s1 when detecting the overcurrent state. When detecting the overcurrent detection signal s1, the logic circuit 12a turns off the main IGBT 1a.

As described above, the overcurrent protection device 10-1 having the configuration of the semiconductor device 1 of FIG. 1 is able to suppress oscillations that occur in the sense current detection signal Vsense, which prevents the overcurrent detection circuit 11 from malfunctioning due to the oscillations and achieves overcurrent detection and protection with high accuracy.

Figure 10:
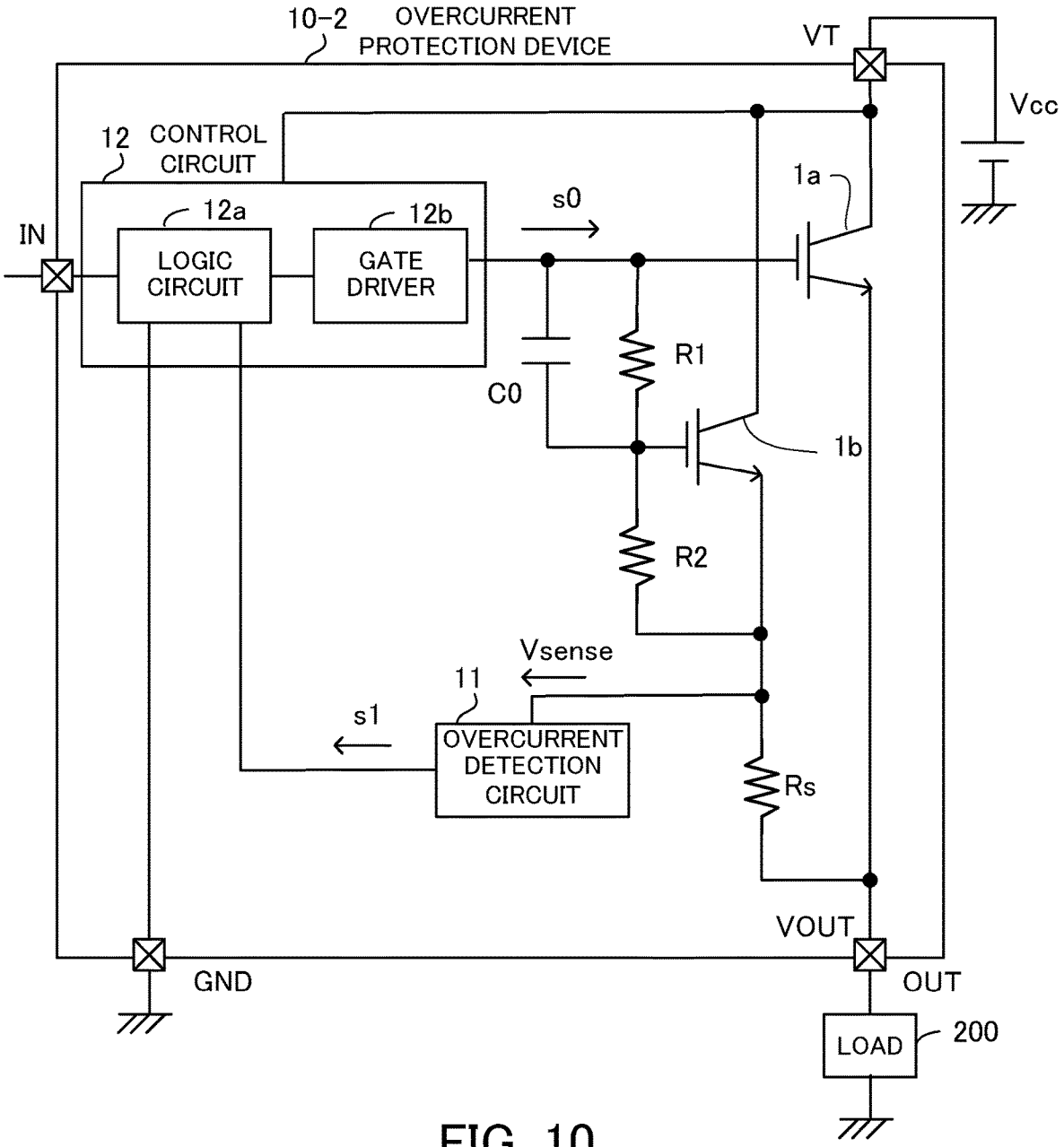
FIG. 10 illustrates an example of a configuration of an overcurrent protection device.

FIG. 10 is a view illustrating an example of a configuration of an overcurrent protection device. An overcurrent protection device 10-2 includes a main IGBT 1a, a sense IGBT 1b, a capacitor C0, resistors R1, R2, and Rs, an overcurrent detection circuit 11, and a control circuit 12. The overcurrent protection device 10-2 is a device to which the semiconductor device 1-2 of FIG. 5 is applied. The overcurrent protection device 10-2 as well is able to suppress oscillations that occur in a sense current detection signal Vsense, which prevents the overcurrent detection circuit 11 from malfunctioning due to the oscillations and achieves overcurrent detection and protection with high accuracy.

Figure 11:
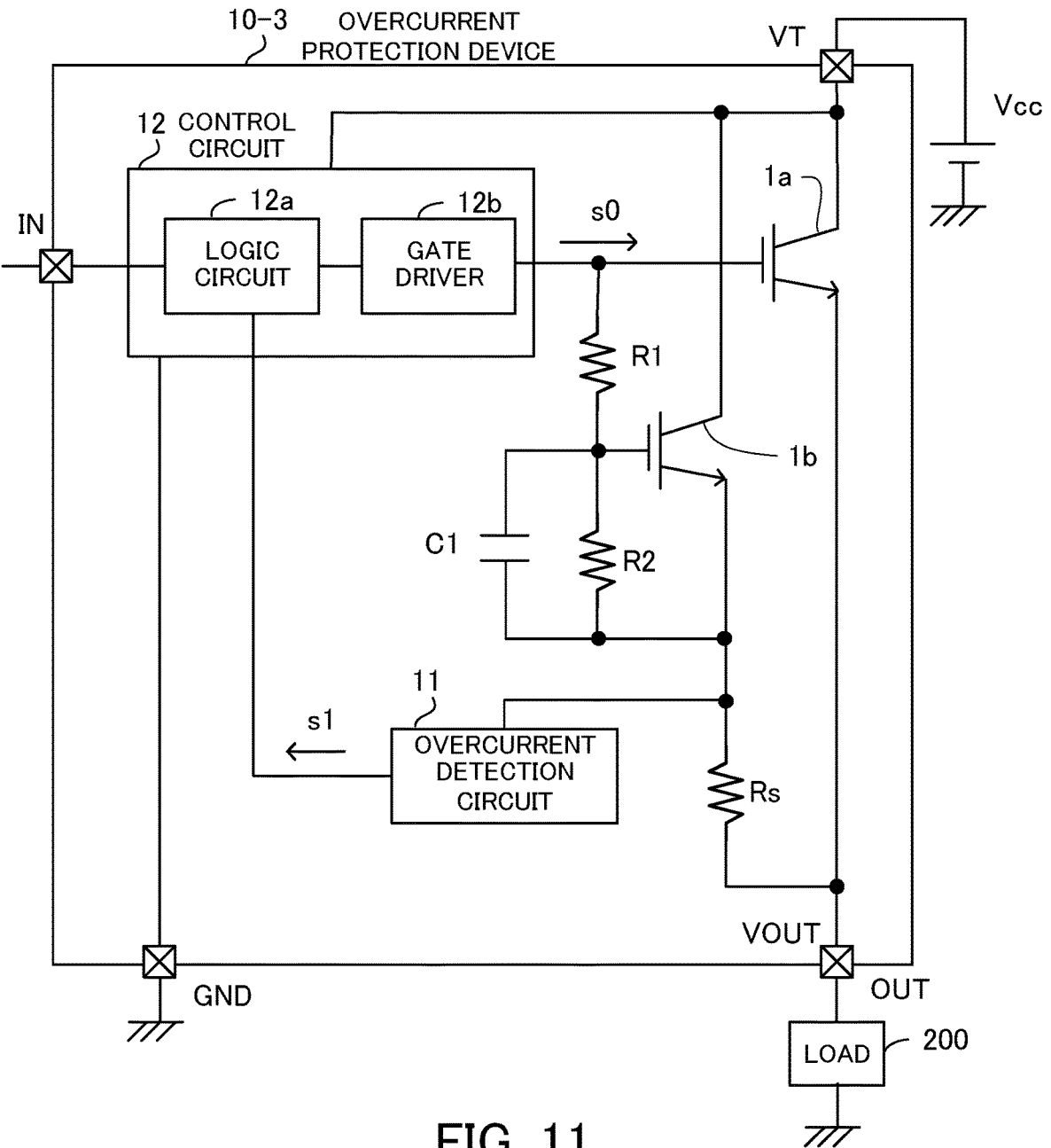
FIG. 11 illustrates an example of a configuration of an overcurrent protection device.

FIG. 11 illustrates an example of a configuration of an overcurrent protection device. An overcurrent protection device 10-3 includes a main IGBT 1a, a sense IGBT 1b, a capacitor C1, resistors R1, R2, an Rs, an overcurrent detection circuit 11, and a control circuit 12. The overcurrent protection device 10-3 is a device to which the semiconductor device 1-3 of FIG. 7 is applied. The overcurrent protection device 10-3 as well is able to suppress oscillations that occur in a sense current detection signal Vsense, which prevents the overcurrent detection circuit 11 from malfunctioning due to the oscillations and achieves overcurrent detection and protection with high accuracy.

As described above, according to the present disclosure, with respect to oscillations that occur in a sense current detection signal output from a current-monitoring power semiconductor element, it is possible to reduce the oscillation voltage and shorten the oscillation period, which means suppressing the oscillations. In addition, it is possible to effectively suppress the oscillations with a passive component with a few elements, without the necessity of using a complex circuit for detecting and controlling the oscillations, which prevents an increase in the circuit scale.

Heretofore, the embodiment has been described. Each component in the embodiment may be replaced with another component having an equivalent function. In addition, other desired configurations and steps may be added. Furthermore, two or more desired configurations (features) in the embodiment described above may be combined.

According to one aspect, it is possible to suppress oscillations that occur in a sense current detection signal output from a current-monitoring power semiconductor element.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
an output element configured to switch on and off according to a drive signal to drive a load;
a current monitoring element configured to monitor a current flowing through the output element;
a capacitor having one end connected to a gate of the output element and another end connected to a gate of the current monitoring element; and
a voltage divider including a first resistor and a second resistor connected in series, the voltage divider having one end connected to the gate of the output element and being configured to divide a gate voltage of the output element and apply a divided voltage to the gate of the current monitoring element, wherein
the capacitor and the first resistor are connected in parallel between the gates of the output element and the current monitoring element.

2. The semiconductor device according to claim 1, wherein each of the output element and the current monitoring element is a power semiconductor element configured by any one of an insulated gate bipolar transistor (IGBT), a reverse conducting (RC)-IGBT, or a silicon carbide (SiC) device.

3. The semiconductor device according to claim 1, further comprising:
a current detection resistor configured to convert a sense current output from the current monitoring element into a voltage and output the voltage as a sense current detection signal; and
an overcurrent detection circuit configured to detect an overcurrent state of the output element, by comparing the sense current detection signal with a reference voltage.

4. The semiconductor device according to claim 3, wherein
the current monitoring element has a sense emitter connected to one end of the current detection resistor and to an input terminal of the overcurrent detection circuit, and
the output element has a collector connected to a collector of the current monitoring element and to a power supply voltage, and has an emitter connected to another end of the current detection resistor and to the load.

5. The semiconductor device according to claim 1, wherein
the gate of the output element is connected to the one end of the capacitor and one end of the first resistor,
the gate of the current monitoring element is connected to the another end of the capacitor, to another end of the first resistor, and to one end of the second resistor,
the current monitoring element has a sense emitter connected to another end of the second resistor, to one end of the current detection resistor, and to an input terminal of the overcurrent detection circuit, and
the output element has a collector connected to a collector of the current monitoring element and to a power supply voltage, and has an emitter connected to another end of the current detection resistor and to the load.

6. A semiconductor device, comprising:
an output element configured to switch on and off according to a drive signal to drive a load;
a current monitoring element configured to monitor a current flowing through the output element;
a voltage divider configured to divide a gate voltage of the output element and apply the divided voltage to a gate of the current monitoring element; and
a capacitor, which is different from a parasitic capacitance present between the gate and a sense emitter of the current monitoring element, having one end connected to the gate of the current monitoring element and another end connected to the sense emitter of the current monitoring element.

7. The semiconductor device according to claim 6, further comprising:
a current detection resistor configured to convert a sense current output from the current monitoring element into a voltage and output the voltage as a sense current detection signal; and
an overcurrent detection circuit configured to detect an overcurrent state of the output element by comparing the sense current detection signal with a reference voltage.

8. The semiconductor device according to claim 7, wherein the voltage divider includes a first resistor and a second resistor, the output element has a gate connected to one end of the first resistor, the gate of the current monitoring element is connected to the one end of the capacitor, to another end of the first resistor, and to one end of the second resistor, the sense emitter of the current monitoring element is connected to the another end of the capacitor, to another end of the second resistor, to one end of the current detection resistor, and to an input terminal of the overcurrent detection circuit, and the output element has a collector connected to a collector of the current monitoring element and to a power supply voltage, and an emitter connected to another end of the current detection resistor and to the load.

9. An overcurrent protection device, comprising:

a power supply terminal connected to a power supply;

an output terminal connected to a load;

an output element connected to the power supply terminal and being configured to receive a power supply voltage through the power supply terminal, the output element being connected to the output terminal and being configured to switch on and off according to a drive signal to drive the load through the output terminal;

a current monitoring element configured to monitor a current flowing through the output element;

a capacitor having one end connected to a gate of the output element and another end connected to a gate of the current monitoring element;

a control circuit configured to output the drive signal to control the switching of the output element;

a voltage divider including a first resistor and a second resistor connected in series, the voltage divider having one end connected to the gate of the output element and being configured to divide a gate voltage of the output element and apply a divided voltage to the gate of the current monitoring element;

a current detection resistor configured to convert a sense current output from the current monitoring element into a voltage and output the voltage as a sense current detection signal; and an overcurrent detection circuit configured to detect an overcurrent state of the output element by comparing the sense current detection signal with a reference voltage, wherein the capacitor and the first resistor are connected in parallel between the gates of the output element and the current monitoring element.

10. The overcurrent protection device according to claim 9, wherein the current monitoring element has a sense emitter connected to one end of the current detection resistor and to an input terminal of the overcurrent detection circuit, and the output element has a collector connected to a collector of the current monitoring element and to the power supply voltage, and has an emitter connected to another end of the current detection resistor and to the load.

11. The overcurrent protection device according to claim 9, wherein the gate of the output element is connected to the one end of the capacitor and to one end of the first resistor, the gate of the current monitoring element is connected to the another end of the capacitor, to another end of the first resistor, and to one end of the second resistor, the current monitoring element has a sense emitter connected to another end of the second resistor, to one end of the current detection resistor, and to an input terminal of the overcurrent detection circuit, and the output element has a collector connected to a collector of the current monitoring element and to the power supply voltage, and has an emitter connected to another end of the current detection resistor and to the load.

12. An overcurrent protection device, comprising:

a power supply terminal connected to a power supply;

an output terminal connected to a load;

an output element connected to the power supply terminal and being configured to receive a power supply voltage through the power supply terminal, the output element being connected to the output terminal and being configured to switch on and off according to a drive signal to drive the load through the output terminal;

a current monitoring element configured to monitor a current flowing through the output element;

a capacitor, which is different from a parasitic capacitance present between a gate and a sense emitter of the current monitoring element, having one end connected to the gate of the current monitoring element and another end connected to the sense emitter of the current monitoring element;

a voltage divider configured to divide a gate voltage of the output element and apply the divided voltage to the gate of the current monitoring element;

a control circuit configured to output the drive signal to control the switching of the output element;

a current detection resistor configured to convert a sense current output from the current monitoring element into a voltage and output the voltage as a sense current detection signal; and an overcurrent detection circuit configured to detect an overcurrent state of the output element by comparing the sense current detection signal with a reference voltage.

13. The overcurrent protection device according to claim 12, wherein the voltage divider includes a first resistor and a second resistor, the output element has a gate connected to one end of the first resistor, the gate of the current monitoring element is connected to the one end of the capacitor, to another end of the first resistor, and to one end of the second resistor, the sense emitter of the current monitoring element is connected to the another end of the capacitor, to another end of the second resistor, to one end of the current detection resistor, and to an input terminal of the overcurrent detection circuit, and the output element has a collector connected to a collector of the current monitoring element and to the power supply voltage, and has an emitter connected to another end of the current detection resistor and to the load.

* * * * *